United States Patent [19]

Simon et al.

[11] 4,164,729
[45] Aug. 14, 1979

[54] SYNCHRO TO DIGITAL TRACKING CONVERTER

[75] Inventors: David J. Simon, Saddle Brook, N.J.; Edward C. Costello, Scarsdale, N.Y.

[73] Assignee: The Singer Company, Little Falls, N.J.

[21] Appl. No.: 853,342

[22] Filed: Nov. 21, 1977

[51] Int. Cl.² .................. G05B 1/00; H03K 13/02
[52] U.S. Cl. ..................... 340/347 SY; 340/347 M
[58] Field of Search .............. 340/347 M, 347 SY; 318/654–661

[56] References Cited

U.S. PATENT DOCUMENTS

| 3,668,693 | 6/1972 | Eaton et al. | 340/347 SY |
| 3,827,045 | 7/1974 | Markus | 340/347 SY X |
| 4,017,846 | 4/1977 | Aramaki | 340/347 SY |

Primary Examiner—Thomas J. Sloyan
Attorney, Agent, or Firm—Thomas W. Kennedy

[57] ABSTRACT

An improved synchro to digital tracking converter which utilizes an approximation to generate information octally and uses digital complementing to generate information over the balance of the quadrant is implemented using a single ladder network to provide a system having fewer components and yet a higher intrinsic accuracy.

13 Claims, 9 Drawing Figures

| OCTANT | SCOTT "T" OUTPUT | | OCTANT SELECT | | SCALING OUTPUT | | COS CHANNEL | REFERENCE PHASING |
|---|---|---|---|---|---|---|---|---|
| | SIN CH | COS CH | SIN CH | COS CH | SIN CH | COS CH | INVERT/NON-INVERT | INVERT/NON-INVERT |
| 0°–45° | +SIN θ | +COS θ | +SIN θ | +COS θ | −SIN θ | +COS θ | N | N |
| 45°–90° | +SIN θ | +COS θ | +COS θ | +SIN θ | −COS θ | +SIN θ | N | I |
| 90°–135° | +SIN θ | −COS θ | −COS θ | +SIN θ | +COS θ | −SIN θ | I | I |
| 135°–180° | +SIN θ | −COS θ | +SIN θ | −COS θ | −SIN θ | +COS θ | I | I |
| 180°–225° | −SIN θ | −COS θ | −SIN θ | −COS θ | +SIN θ | −COS θ | N | I |
| 225°–270° | −SIN θ | −COS θ | −COS θ | −SIN θ | +COS θ | −SIN θ | N | N |
| 270°–315° | −SIN θ | +COS θ | +COS θ | −SIN θ | −COS θ | +SIN θ | I | N |
| 315°–360° | −SIN θ | +COS θ | −SIN θ | +COS θ | +SIN θ | −COS θ | I | N |

FIG. 3A

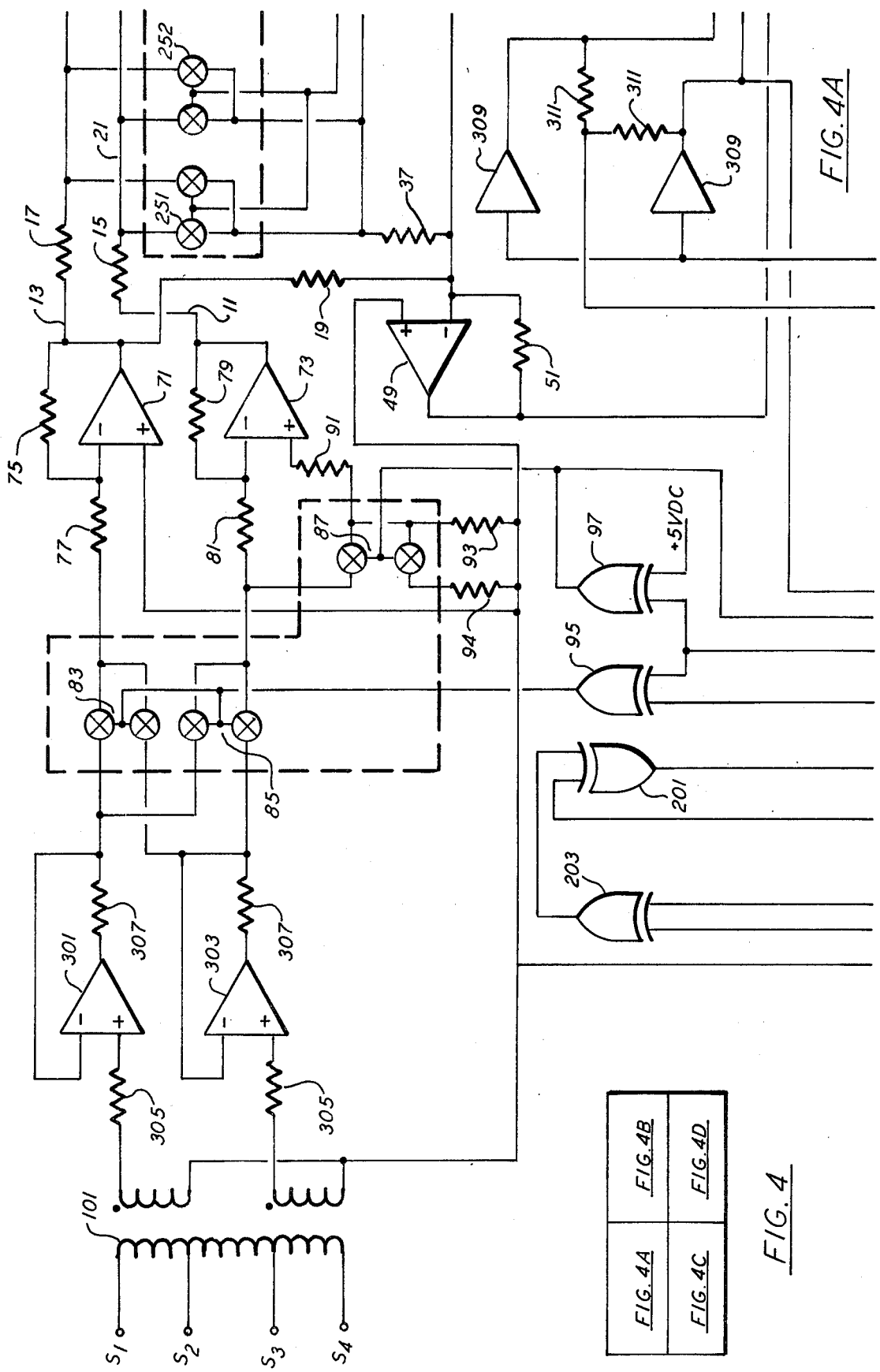

SYNCHRO TO DIGITAL TRACKING CONVERTER

BACKGROUND OF THE INVENTION

This invention relates to synchro to digital tracking converters in general and more particularly to an improved synchro to digital tracking converter which contains fewer components than those of the prior art and yet has a higher intrinsic accuracy.

Synchro to digital tracking converters are used most commonly to accept analog synchro information and translate that information into a digital format which can be understood by a digital computer. The net result of this translation is the ability of a computer to, for example, interrogate a synchro to determine the angular position of its shaft. A tracking converter differs from the other types of converters, i.e., successive approximation and sampling, in that there is no minimum conversion time required to generate the angular information. Furthermore, tracking converters most commonly have a feedback loop which simulates a Type II servo loop, which allows it to track a constantly changing input with no lag errors. (The velocity constant approaches infinity until the maximum tracking speed is reached.)

Basic to all tracking converters is the ability to accurately generate a steering voltage whose magnitude and phase contains information which causes the Type II control loop to null itself when the digital output angle $\beta$ to representative of the analog input information $\theta$. Most commonly, the steering voltage is proportional to $\sin(\theta - \beta)$ because this expression does null itself as $\theta$ approaches $\beta$.

Most commonly, the function which is actually implemented is the trigonometric expression:

$$\sin(\theta - \beta) \equiv \sin\theta \cos\beta - \cos\theta \sin\beta.$$

Sin $\theta$ and cos $\theta$ are given analog inputs to the converter. They are either provided directly, when the inputs are four wire resolver signals, or are generated by standard Scott "T" transformers from three wire synchro inputs. In order to implement the expression, it is necessary to generate information representing sin $\beta$ and cos $\beta$.

The non-linear functions sin $\beta$ and cos $\beta$ are generated from the linear digital output angle $\beta$ by means of an approximation which forms the "heart" of the converter.

Prior state of the art converters most typically generated the sin $\beta$, cos $\beta$ approximation by use of two sets of precision ladder networks and two sets of switches.

Information was generated over a full quadrant (0° to 90°) and quadrant switching was required to artificially maintain the information in the first quadrant. Furthermore, a commonly used approximation was that:

$$\sin\beta \approx \frac{K_1 N}{1 + K_1 + N}$$

$$\cos\beta \approx \frac{K_1(1 - N)}{1 + K_1(1 - N)}$$

where $K_1$ is the best fit constant from 0° to 90°, and is equal to 0.555R.

N is a running variable from 0 to 1 as the output angle $\beta$ varies from 0° to 90°. This approximation is accurate to within ±1.8 arc minutes over the quadrant, when evaluated as a tangent function, i.e., when $$\tan\theta = \frac{\sin\theta}{\cos\theta} = \frac{\sin\beta}{\cos\beta} = \tan\beta.$$

Since the end item accuracy is most typically four arc minutes, this inherent error is a significant portion of the total error budget.

The use of two ladder networks and two sets of switches represent duplication of the most costly and critical components in the converter. Furthermore, the impedance of the switch in the most significant bit of the ladder network, with a weight of 45°, represented a significant error source, since a 20 ohm error in series with a nominal resistance of 20,000 ohms (i.e., a 0.1% error) would be an error source of 1.35 arc minutes.

Thus, it can be seen that there is a need for a simpler, more accurate synchro to digital tracking converter.

SUMMARY OF THE INVENTION

The present invention provides such through the use of a new approximation which rquires fewer components and yet has a higher intrinsic accuracy.

The new approximation generates information octally and uses digital complementing to generate the information over the balance of the quadrant. Octant selection is used to artificially maintain the information in the first octant. The approximation developed is that:

$$\sin\beta \approx \frac{K_1 N}{1 + K_1 N}$$

$$\cos\beta \approx \frac{K_2(1 - N)}{1 + K_2(1 - N)} + K_3$$

Where $K_1$ is the best fit constant for a sine function from 0° to 45° and is equal to 0.316R.

$K_2$ is the best fit constant for a cosine function from 0° to 45° and is equal to 0.195755R.

$K_3$ is the constant at the end point and is equal to $$\frac{K_1}{1 + K_1} = .240122R$$

N is a running variable from 0 to 1 as $\beta$ varies from 0° to 45°.

This approximation, when evaluated as a tangent function, is accurate to within ±0.5 arc minutes, significantly better than the ±1.8 arc minutes attained by the conventional approximation.

Since $\sin(\theta - \beta) = \sin\theta \cos\beta - \cos\theta \sin\beta$ $$\sin(\theta - \beta) \approx \sin\theta \left[\frac{K_2(1 - N)}{1 + K_2(1 - N)} + K_3\right] - \cos\theta \frac{K_1 N}{1 + K_1 N}$$

at null, $\sin(\theta - \beta) = 0$ $$\therefore \sin\theta \times K_2 \left[\frac{1}{K_2 + \frac{1}{1 - N}} + \frac{K_3}{K_2}\right] -$$

$$\cos\theta K_1 \frac{1}{K_1 + \frac{1}{N}} \approx 0$$

-continued $$\sin\theta \times \frac{K_2}{K_1} \times \left[ \frac{1}{K_2 + \frac{1}{N-1}} + \frac{1}{K_2/K_3} \right] - \cos\theta \frac{1}{K_1 + \frac{1}{N}} = 0$$

This equation is implemented using one precision ladder network and one set of single pole, double throw switches. Since the $\sin\theta$ term has a scaling of $K_2/K_1=0.61948$ and since opposite polarities of $\sin\theta$ and $\cos\theta$ must be maintained so that the expression always sums toward zero, the proper scaling and phasing is maintained by the octant select circuitry which is required to order to artificially maintain the $\sin\theta$, $\cos\theta$ information in the first octant.

Although the octal embodiment is shown, the single ladder concept is also usable over a quadrant with the well known constant 0.555R used.

BRIEF DESCRIPTION OF THE DRAWINGS

FIG. 3A is a Table helpful in understanding the operation of FIG. 3.

FIGS. 4A-D combined are a logic circuit diagram of the system of FIG. 4.

DETAILED DESCRIPTION OF THE INVENTION

Figure 1:
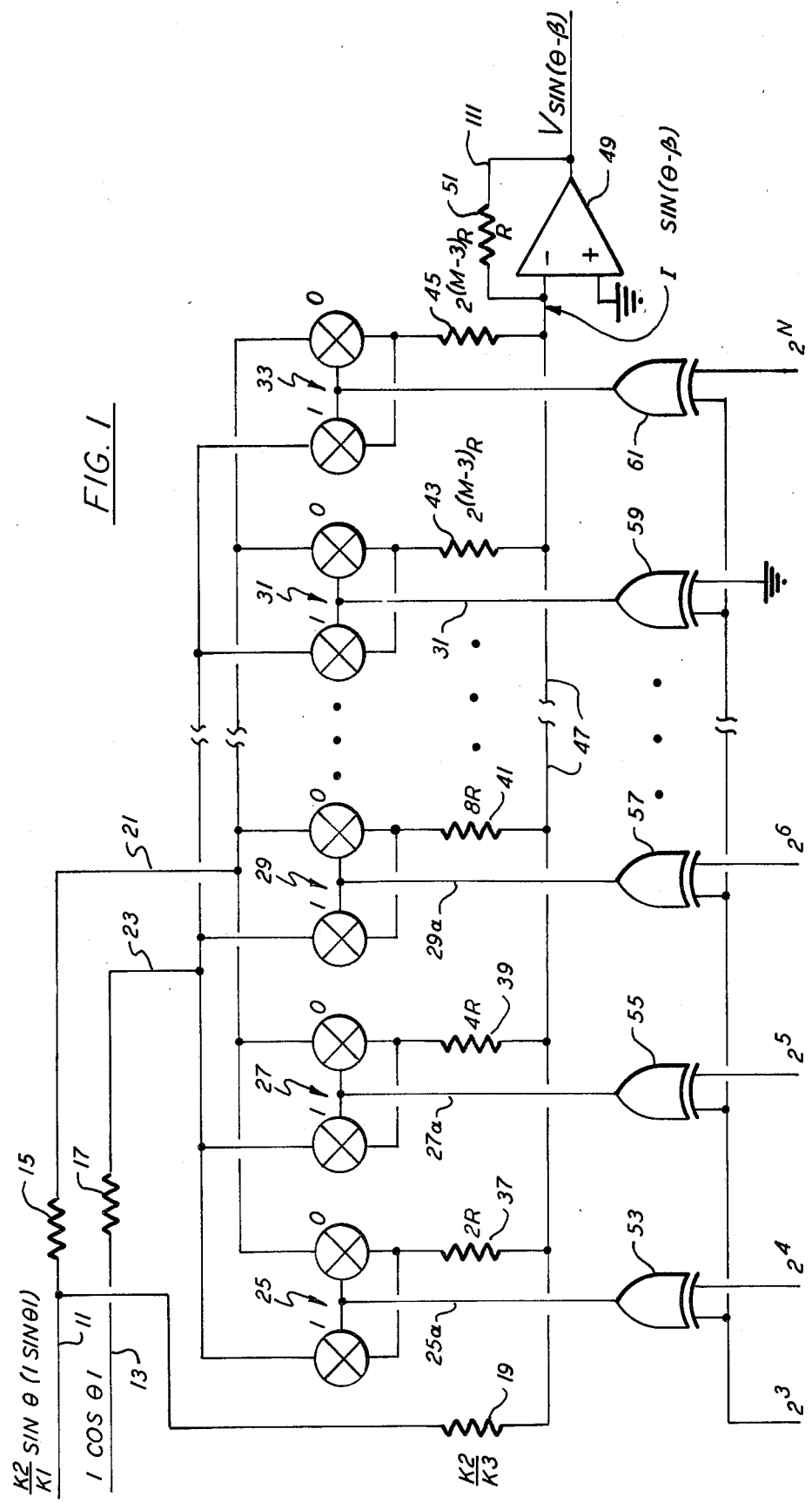
FIG. 1 is a logic diagram of a sine-cosine generator according to the present invention.

FIG. 1 is a circuit-logic diagram illustrating the manner in which the approximation of the present invention is implemented. Synchro input voltages $K_2/K_1 \sin\theta$ and $\cos\theta$, developed in a manner to be described below, are provided respectively on lines 11 and 13, the sine voltage on line 11 coupled through a resistor 15 having a relative value $K_2$ and the cosine value on line 13 through a resistor 17 having a relative value $K_1$. The sine voltage on line 11 is also provided to a resistor 19 having a relative value $K_2/K_3$. The line coming from the resistor $K_2$ is designated 21 and that from resistor 17 as 23. Both lines are coupled through a resistor ladder network by means of a plurality of single pole double throw switches. Thus, there are shown switches 25, 27, 29, 31, and 33. The switches will be implemented preferably using semi-conductor analog switching devices such as CD 4053 BF manufactured by R.C.A. Each switch has a control input. The control inputs for the respective switches being designated 25a, 27a, 29a, 31a and 33a. Each switch is shown as having two halves, i.e., two poles, one designated "1" and the other designated "0". This indicates that if, for example, a 1 input is present on a control input 25a, the 1 section of switch 25 will be closed. Similarly, if the input is a 0, the 0 side of the switch will be closed. The "1" sides of all of the switches 25, 27, 29, 31 and 33 have as their input the cosine signal on line 23. Similarly, all the "0" sides of the switches have as their input the sine signal on line 21. The outputs of both sides of each switch are tied together into a resistor, the resistors forming the ladder network. Thus, the output of the switch 25 is tied to a resistor 37 having a relative value 2R. The switch 27 is tied to a resistor 39 having a relative value 4R. The output of switch 29 is tied to resistor 41 having a relative value 8R. Between the switch 29 and the switch 31, there are a plurality of additional switches, not shown, the exact number depending on the resolution of the converter. The switch 31, has its output tied to a resistor 43 having a relative value $2^{(M-3)}$ R where M is the resolution of the converter. The output of switch 33 is tied to a resistor 45 having the same value. The other sides of all the resistors 37, 39, 41, 43 and 45, along with resistor 19, are tied to a line 47 which is coupled to the inverting input of an amplifier 49 having a feedback resistor 51 of Rf value which will give a convenient scale factor in its feedback path. The respective switches 25, 27, 29, 31, and 33, are controlled by exclusive OR gates 53, 55, 57, 59 and 61. Each of the gates have as one input the $2^3$ bit. The gates 53 has as a second input the $2^4$ bit, the gate 55 the $2^5$ bit, the gate 57 the $2^6$ bit and the gate 61 the $2^n$ bit. The angle $\beta$ is represented by the digital inputs to the exclusive OR gates 53, 55, 57 and 59. Gate 59 has its second input grounded. With the circuit of FIG. 1 the expression $$\sin\theta \times \frac{K_2}{K_1} \times \left[ \frac{1}{K_2 + \frac{1}{N-1}} + \frac{1}{K_2/K_3} \right] - \cos\theta \frac{1}{K_1 + \frac{1}{N}} = 0$$

is implemented as a voltage, where the K terms and the N terms are resistances and admittances. More precisely, $$\underbrace{V_1 \sin\theta \times \frac{K_2}{K_1}}_{\text{scaled input voltage}} \times \underbrace{\left[ \frac{1}{K_2 R + \frac{R}{(1-N)}} + \frac{1}{\frac{K_2 R}{K_3}} \right]}_{\text{resistive terms}} \times \underbrace{Rf}_{\text{feedback resistor}}$$

current $\alpha \sin\theta \cos\beta$ voltage $\alpha \sin\theta \cos\beta$ and similarly, the $$\cos\theta \frac{1}{K_1 + \frac{1}{N}}$$

is implemented as $$V_1 \cos\theta \frac{1}{K_1 R + \frac{R}{N}} \times R_1,$$

a voltage proportional to $\cos \theta \sin \beta$, and the voltage sum at the output of the operational amplifier 49 is the steering voltage proportional to $\sin \theta \cos \beta - \cos \theta \sin \beta$. The R/N term perhaps needs further explanation. The impedance in series with resistor 17 can be expressed as the parallel impedances $$R_{N1} = \cfrac{1}{\cfrac{A_0}{2R} + \cfrac{A_1}{4R} + \cfrac{A_2}{8R} \cdots}$$

where each $A_0$, $A_1$ etc. has a value of 0, if the switch is open, or 1 is the switch is closed.

$$\therefore R_{N1} = \cfrac{1}{\cfrac{1}{R}\left(\cfrac{A_0}{2} + \cfrac{A_1}{4} + \cfrac{A_2}{8}\right)\cdots} =$$

$$\cfrac{R}{\left(\cfrac{A_0}{2} + \cfrac{A_1}{4} + \cfrac{A_2}{8}\right)\cdots}$$

$$\therefore R_{N1} = \cfrac{R}{N}$$

where N varies from 0 to 1 as the switches open and close, i.e., as $\beta$ varies from 0° to 45°.

Similarly, the impedance in series with resistor 16 can be shown to be $$R_{N2} = \cfrac{R}{1-N}.$$

(The second resistor 43 labeled $2^{(M-3)}R$ which is controlled by the $2^3$ bit is the roundoff resistor required to make the series of parallel resistors, with all switches closed, exactly equal to R i.e., an infinitely long network $M \to \infty$.

It can be seen that each resistor of the ladder network is always coupled to either resistor 15 or resistor 17, but is never required to be switched to both, nor neither, resistor at the same time. Therefore, the one resistor network can be shared between implementation of the $\sin \beta$ function and implementation of the $\cos \beta$ function. This is a significant reduction in component cost, complexity and error sensitivity (there is no mistracking between networks as in the conventional implementation). No switches are required in series with resistors 15, 17 or 19, removing another significant error source. As noted above, such sharing is also possible when implementing the more conventional conversion using the constant 0.555R.

The new approximation demonstrates less sensitivity to switch impedance in the ladder network. An error of 0.1% caused by switch impedance in series with the most significant bit of the network causes an error of only 0.65 arc minutes, which is half the sensitivity displayed by the conventional approximation.

Conventional digital complementing is used to allow the octant information to be valid for the entire first quadrant. This is accomplished by taking advantage of the inherent symmetry of the sine and cosine functions about 45°. The exclusive OR logic which provides the complement capability also serves to isolate the digital output $\beta$ from the actual switch control lines. Since these control lines are often sensitive to static electricity, when CMOS switches are used, the exclusive OR logic can be used to prevent the outputs from being damaged by static electricity, minimizing handling precautions required of the end item user. The octant select circuit is capable of inverting or non-inverting the $\cos \theta$ term so that, regardless of the actual quadrant, the appropriate phase relationship is maintained. It also channels the larger of the $\sin \theta$, $\cos \theta$ signals into the $|\cos \theta|$ input on line 13, and similarly places the smaller signal into the $|\sin \theta|$ input on line 11 as a function of octant.

Figure 2:
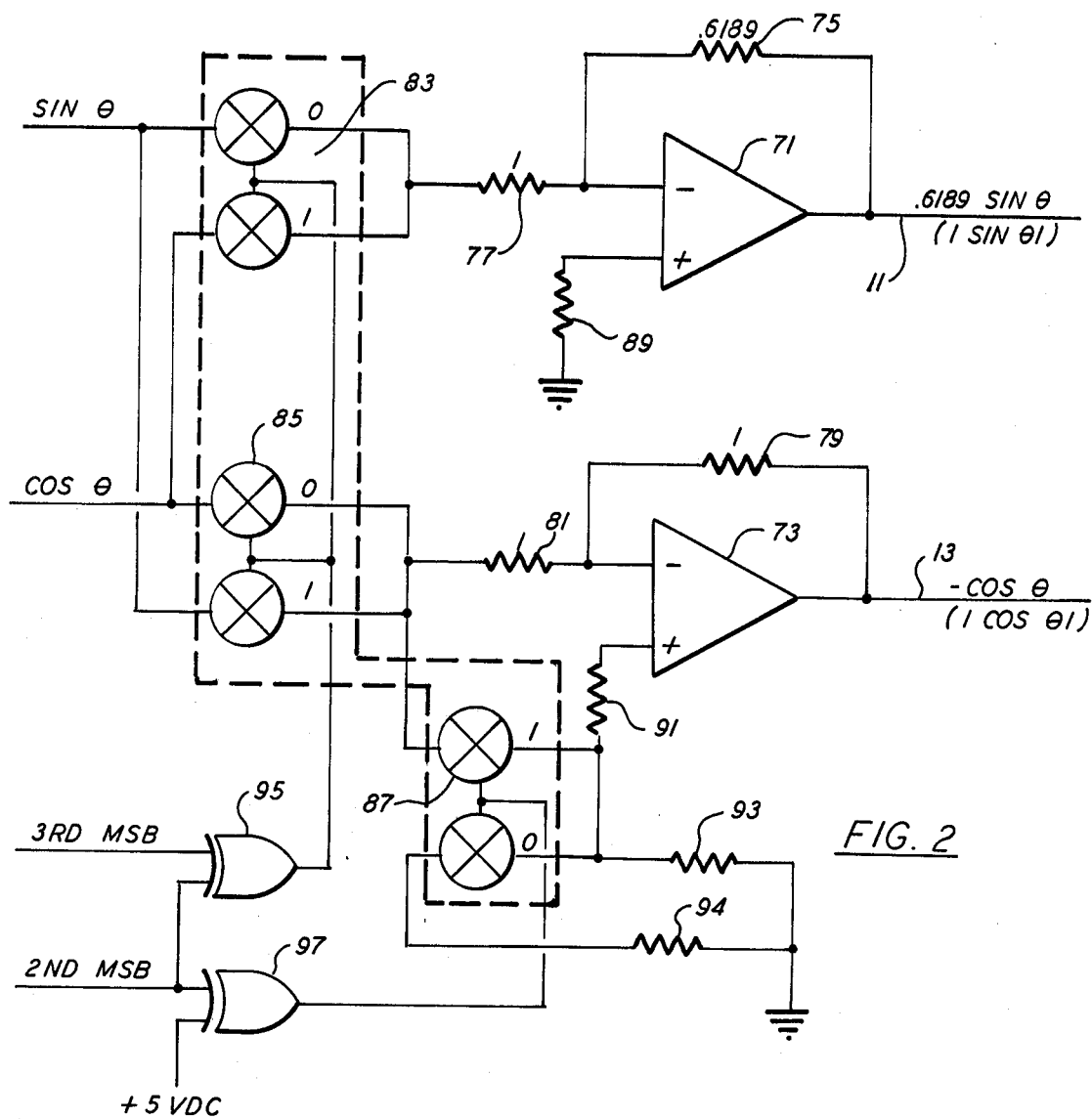
FIG. 2 is a similar diagram of an embodiment for octant selection.

FIG. 2 illustrates the octant selection circuit and scaling. This circuit includes two operational amplifiers 71 and 73. The operational amplifier 71 is the one which provides the $K_2/K_1 \sin \theta$ signal on line 11. It has a feedback resistor 75 and an input resistor 77. The relative ratio of feedback to input is 0.618921. The amplifier 73 has a feedback resistor 79 and an input resistor 81 of equal value so as to result in a gain of 1. It provides $-\cos \theta$ on line 13. The circuit also includes three switches 83, 85 and 87, of the same type described above, in connection with FIG. 1. The $\sin \theta$ signal from the resolver is the input to the "0" half of switch 83 and the "1" half of switch 85. The $\cos \theta$ signal from the resolver is the input to the "1" half of switch 83 and the "0" half of switch 85. The outputs of switch 83 are tied together and coupled to the input resistor 77 of amplifier 71. Similarly, the outputs of switch 85 are tied together and coupled to the input resistor 81 of amplifier 73. Amplifier 71 has its non-inverting input grounded through a resistor 89. The non-inverting input to the amplifier 73 is controlled by the switch 87. The output of the switch 85 also forms an input to the "1" half of the switch 87. The output of this part of the switch is coupled through a resistor 91 to the non-inverting input. The output of this switch also couples to a resistor 93 having its other side connected to ground. The input to the "0" half of the switch 87 is also connected to ground. The switches 83 and 85 are controlled by an exclusive OR gate 95 having an inputs the second and third most significant bits. If only one of these is present, the exclusive OR gate will have a "1" output. This will couple the sine signal to the amplifier 73 and the cosine signal to the amplifier 71. If neither bit is present or if both bits are present, the cosine signal will be coupled to the amplifier 73 and the sine signal to amplifier 71. The switch 87 is controlled by an exclusive OR gate 97 having as its one input to $+5$ volts DC and as its second input the second most significant bit input. If the output of the gate 97 is a 1, the output of switch 85 is coupled into the input resistor 91. If it is a 0, the "0" half of the switch closes and the non-inverting input is essentially grounded. In a converter of this nature, as is well known, the most significant bit represents 180°, and the second most significant bit 90° and the third most significant bit 45°. Thus, the second most significant bit determines which quadrant the angle is in. Thus, this circuit acts to invert the cosine signal in the first and third quadrants and to not invert it in the second and fourth quadrants.

Figure 3:
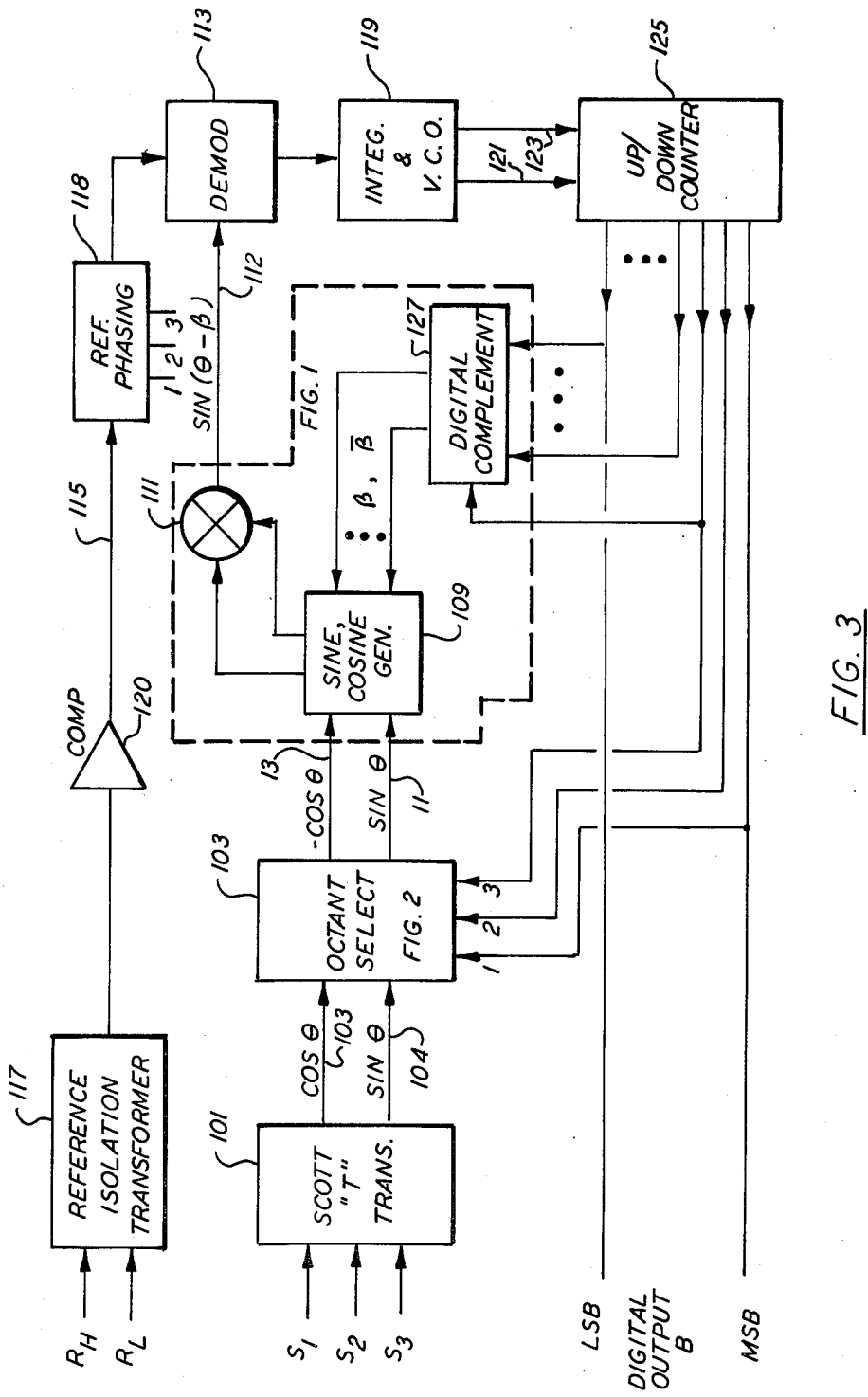
FIG. 3 is a block diagram of an overall conversion system utilizing the circuits of FIGS. 1 and 2.
Figure 4B:
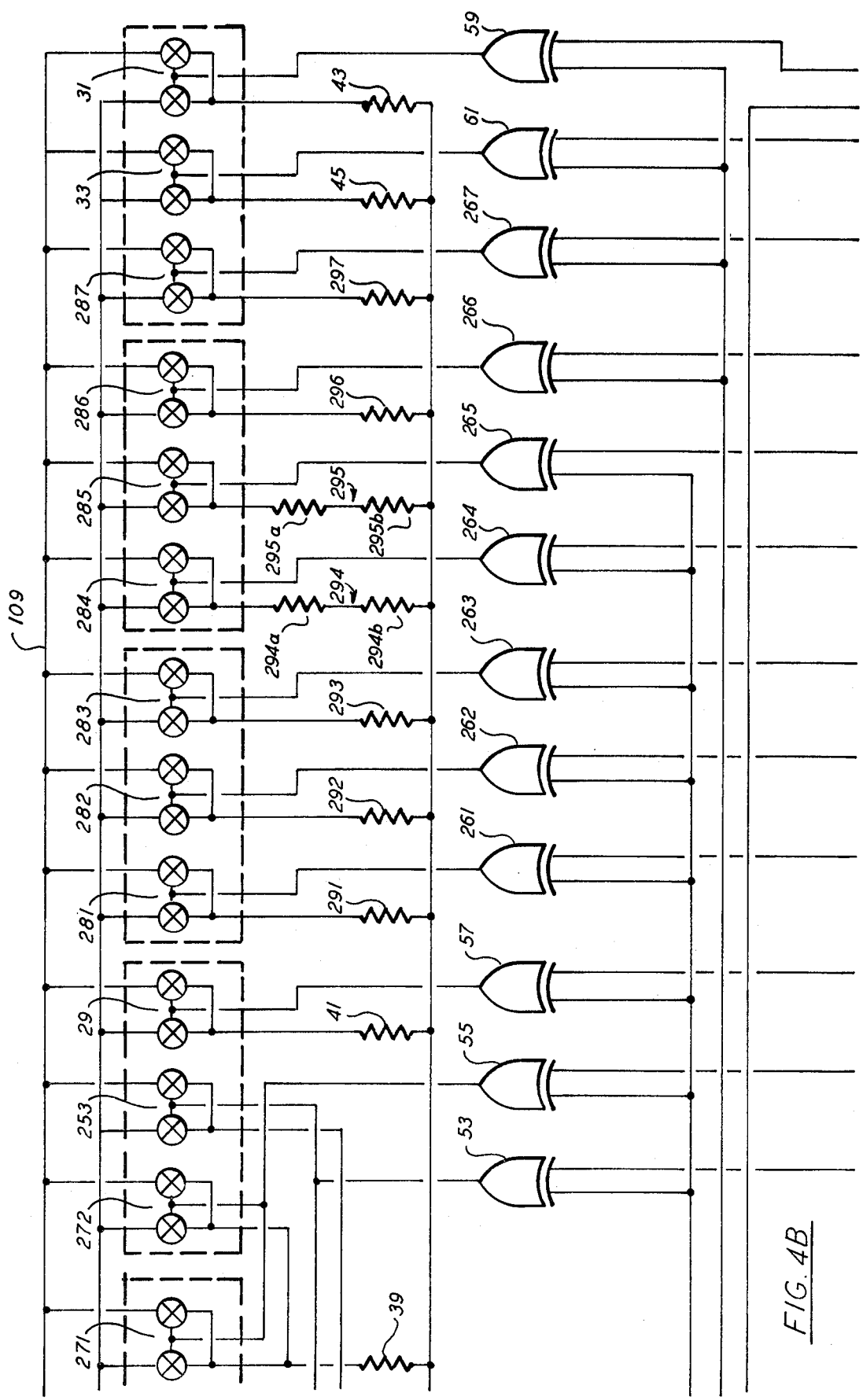
Figure 4C:
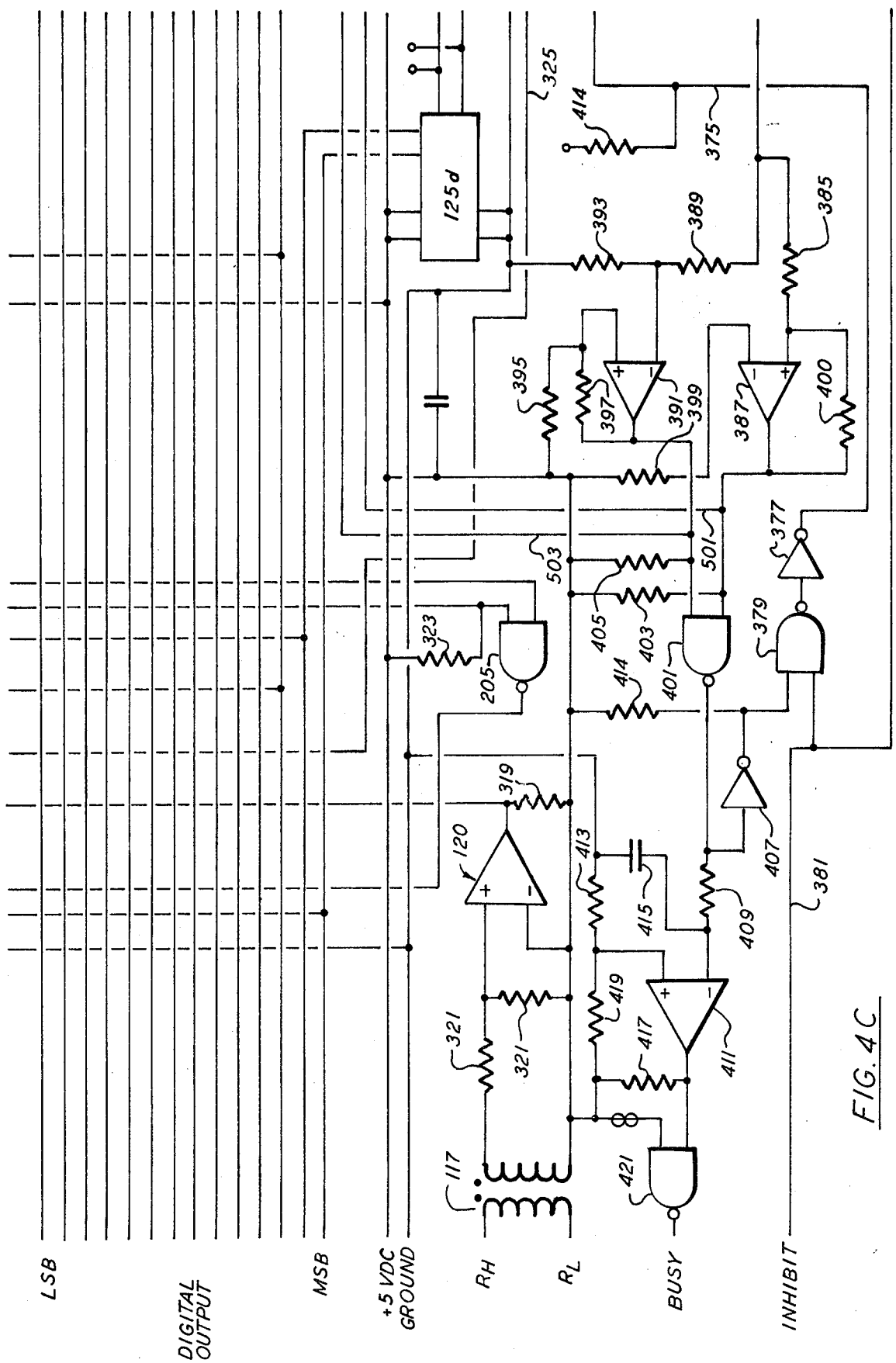
Figure 4D:
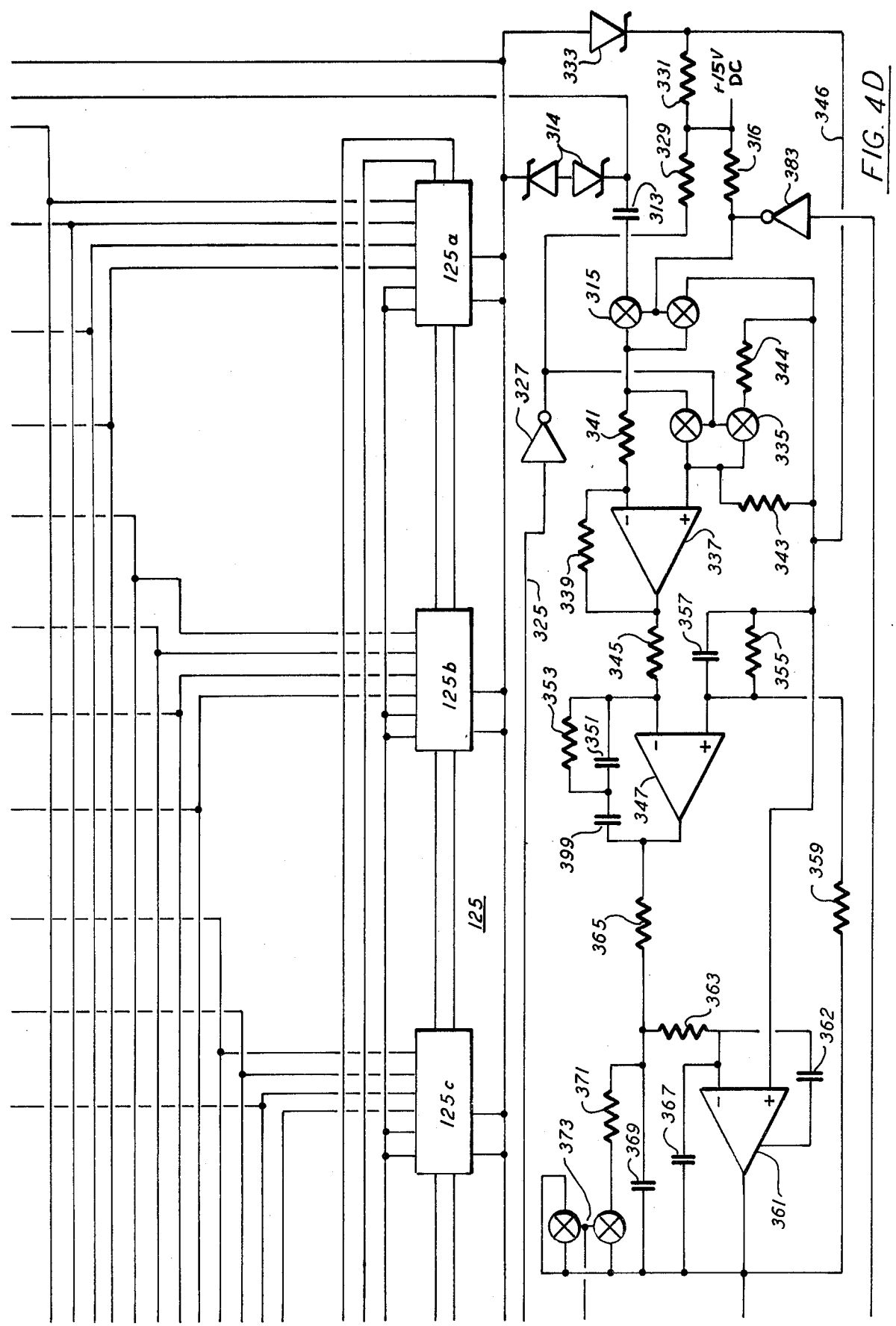

FIG. 3 illustrates an overall block diagram of the system. Assuming, that the input is from a synchro rather that a resolver, the synchro inputs $S_1$, $S_2$ and $S_3$ are provided to Scott "T" transformer 101, the output of which will be cosine $\theta$ and sin $\theta$ on lines 103 and 104, respectively. These outputs are coupled into an octant selection module 103 providing as outputs a $-\cos \theta$ signal on line 13 and a $\sin \theta$ signal on line 11. These form inputs to the sine/cosine generator 109, described above in connection with FIG. 1. The octant select module 103 is controlled from three bits of the digital signal in a manner described more fully above in connection with FIG. 2. The output of the sine/cosine generator 109 is coupled into a summer 111 which takes the difference of $\theta$ and $\beta$, $\theta$ being the analog angle from the synchro and $\beta$ being the digital angle. This is implemented as amplifier 49 of FIG. 1. This output is coupled into a demodulator 113 having a reference input on line 115 obtained from a reference isolation transformer 117, through a comparator 120 which converts it to a square wave. In the demodulator, the sin $(\theta-\beta)$ signal is demodulated and forms an input to an integrator and voltage controlled oscillator unit 119. This module provides two outputs, a clock signal and a directional signal, respectively, on lines 121 and 123. These are inputs to an up-down counter 125, the clock being coupled into the count input thereof, and the direction signal on line 123 into the up/down input thereof. The output of the up-down counter 125 is the digital angle $\beta$. The third through nth bits thereof are coupled into a digital complement module 127, the output of which is the input angle $\beta$ to the sine-cosine generator 109. The complement module is implemented with the exclusive OR gates of FIG. 1. The third bit is the complement bit. In other words, when that bit is absent, the digital angle is coupled through directly and when that bit is present, the complement of the angle is coupled through. The third bit is the 45° bit and thus, complementation takes place in every other octant. In general terms, in operation the sine-cosine generator 109 and the summing means 111 generate an error signal representative of the error between the actual angle $\theta$ and the digital output and $\beta$. This error is demodulated in the demodulator 113 and provided to the integrator in the module 119. The integrator adjusts itself in accordance with the error, the output of the integrator driving the voltage controlled oscillator. The output of the voltage controlled oscillator in turn increments the counter up and down to bring the angle $\beta$ into agreement with the angle $\theta$.

Because the only constraint on the octant select circuit is to maintain opposite polarities between sin $\theta$ and cos $\theta$ in the same octants, a positive error or sterring voltage would indicate a "positive" angular error, in other octants the same voltage would indicate a "negative" error. This would seemingly indicate that the phasing of the steering voltage was not containing the correct information. This phase information is interpreted by the phase sensitive demodulator 113 of FIG. 3, which is referenced by the phase of the reference voltage. The phasing of the reference voltage is changed versus the octant so that the phasing information of the steering voltage is always correctly interpreted by the phase sensitive demodulator by a reference phase module 118. The required logic for the octant select circuit 103, including which inputs the sin $\theta$ and cos $\theta$ information should be channeled to, which polarity (invert or non-invert) the cos $\theta$ channel should have and whether the reference voltage phasing should be inverted or non-inverted in order to correctly interpret the steering voltage, can be determined from the chart of FIG. 3A.

Implementation of the logic for the octant select circuit consists simply of the exclusive OR gate 95 decoding the second and third most significant bits of $\beta$ as follows:

| 1st | 2nd | 3rd | Output |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 0 |
| 1 | 0 | 1 | 1 |
| 1 | 1 | 0 | 1 |
| 1 | 1 | 1 | 0 |

When the output 0, the sin $\theta$ input is channeled to the "sine" output, and the cos $\theta$ input is channeled to the "cosine" output. When the output is a 1, the sin $\theta$ input is channeled to the "cosine" output, and the cos $\theta$ input is channeled to the "sine" output.

Implementation of the logic for the cosine invert/non-invert function is simply the 2nd M.S.B. through gate 97. For the 2nd M.S.B.=0, the cosine channel shall be non-inverted, for 2nd M.S.B.=1, the cosine channel shall be inverted. The switching controlled by this logic is standard in that the operational amplifier 73 is connected as a voltage follower for a non-inverting function and as a unity gain inverting amplifier for the inverting function.

Figure 5:
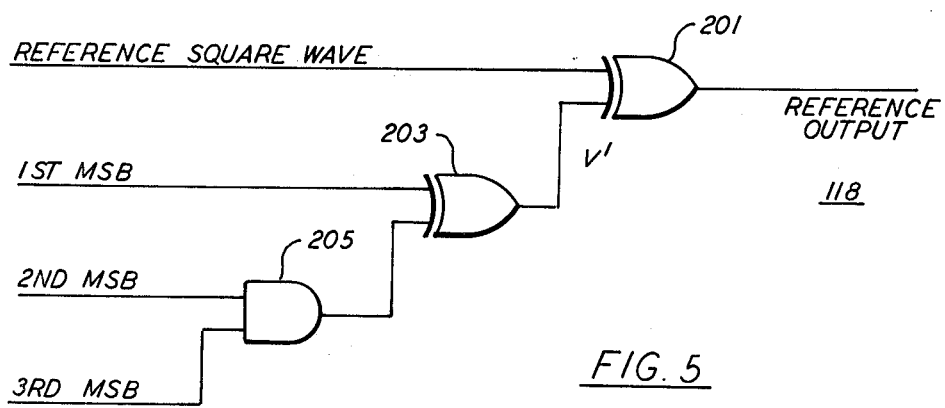
FIG. 5 is a logic diagram of the reference phasing block of FIG. 3.

FIG. 5 illustrates the implementation of the reference phasing inversion/non-inversion of block 118 of FIG. 3. As indicated, the reference voltage from the transformer 117 is coupled through a comparator 120 to generate a square wave. As shown by FIG. 5, the reference square wave is an input to an exclusive OR gate 201. The second input to gate 201 is from another exclusive OR gate 203 having as one input the first most significant bit. The second input to gate 203 is the output of an AND gate 205 having as inputs the second most significant bit and third most significant bit. This circuit has the following truth table:

| $2^1$ | $2^2$ | $2^3$ | $V^1$ | REFERENCE OUTPUT |
|---|---|---|---|---|
| 0 | 0 | 0 | 0 | non-inverted reference |
| 0 | 0 | 1 | 1 | inverted reference |
| 0 | 1 | 0 | 1 | inverted reference |
| 0 | 1 | 1 | 1 | Inverted reference |
| 1 | 0 | 0 | 1 | Inverted reference |
| 1 | 0 | 1 | 0 | non-inverted reference |
| 1 | 1 | 0 | 0 | non-inverted reference |
| 1 | 1 | 1 | 0 | non-inverted reference |

The steering voltage thus generated is used to provide the required magnitude and phasing information to the feedback loop of FIG. 3 which typically simulates a Type II servo loop.

Thus the phase sensitive demodulator 113 generates a polarity sensitive d-c voltage from the 400 Hz steering voltage on line 112. This d-c voltage is integrated by a conventional operational amplifier integrator in block 119. The appropriate loop frequency stabilization can be incorporated into the same operational amplifier. The output is fed into a voltage controlled oscillator, also in block 119, which generates pulses at the appropriate frequency and which is used to increment up/down counts in the appropriate direction. The output of the counter 125 contains the output angle $\beta$ directly, which is used to control the ladder network in generator 109 generating the steering voltage. This circuitry displays the capability to maintain a null at the steering voltage even when the counter is being rapidly changed i.e., when the converter is tracking a constantly changing input.

The feedback loop characteristic equation is typically $$40,000 \frac{1}{S^2} \frac{1 + \frac{S}{100}}{1 + \frac{S}{1000}}$$

It has an acceleration constant $K_a = 40,000$. The voltage controlled oscillator typically can generate a maximum frequency, before saturation, which allows a 14 bit resolution converter to track a constantly changing input at speeds up to 3600°/sec.

FIGS. 4A-D are a detailed diagram of the converter of the present invention. Parts which are identical to those previously described, will be given the same reference numerals. As previously described, the input signal is coupled through Scott "T" transformer 101. Isolation amplifiers 301 and 303 connected as voltage followers are provided. Each has a resistor 305 coupling the sine or cosine signal into its non-inverting input and an output resistor 307 from which negative feedback is coupled back to the inverting input. The outputs of these amplifiers are the inputs to the switches 83 and 85 described in connection with FIG. 2. The switches along with switch 87 are contained within a module designate $U_{11}$. The outputs of the amplifier 71 and 73 on lines 11 and 13 are as described above. In the embodiment shown on FIG. 4A-D, in the sine-cosine generator 109, three switches, 251, 252 and 253, in parallel, all have their outputs coupled to the resistor 37 and are functionally equivalent to the switch 25. This is done to compensate for variations in switch resistance. Similarly, two switches in parallel, 271 and 272, feed the resistor 39. The additional switches not shown on FIG. 1 for the remaining bits are shown. Thus, there are switches 281, 282, 283, 284, 285, 286, and 287, in addition to the switches 25, 27, 29, 31 and 33 of FIG. 1. Associated with the respective switches 281-287 are resistors 291-297. The resistors 294 and 295 are made up of two resistors in parallel designated as 294a and b and 295a and b. The relative resistance ratios remain as shown in FIG. 2, as will be described in more detail below. Naturally, with these additional switches, additional exclusive OR gates are required. Thus, in addition to the exclusive OR gates 53, 55, 57, 59 and 61, there are shown exclusive OR gates 261-267 associated respectively with the switches 281-287. Because the $2^3$ bit must be coupled into each of these exclusive OR gates, drivers 309 having their inputs coupled to the $2^3$ bit and their outputs coupled across a resistor network comprising two resistors 311 of equal value are provided. These outputs are then coupled to groups of the exclusive OR gates to provide the one input thereto. Because the drivers 309 invert the positions of the "0" and "1", inputs to the switches of FIGS. 4A-D are the inverse of those of FIG. 1.

The up/down counter 125 is made up of four counter stages 125a, 125b, 125c and 125d. The output of the ladder network, as described above, is the input to amplifier 49 with the feedback resistor 51 in its feedback path. The output thereof is the error or steering voltage. It is coupled through a capacitor 313 to a switch 315. Before explaining further the input at this switch, the generation of the reference phasing will be described.

Shown is the reference isolation transformer 117 and the comparator 120. As illustrated, the comparator 120 has a pull up resistor 319 coupling its output to +5 v. The reference voltage output of the transformer 117 is coupled across a voltage divider made up of two equal resistors 321 with the center tap thereof coupled to the non-inverting input of the comparator 120. The transformer is referenced to +5 volts in order to avoid voltages below ground potential. The comparator 120 provides a square wave voltage input to the exclusive OR gate 201 described above in connection with FIG. 5. That gate, along with gates 203 and 205 carry out the phase reversal as described above. The only difference with respect to FIG. 5 is that the one input to gate 205 is taken from the driver 309 and the second input from the output of gate 97 of FIG. 2 associated with the octant select circuit. This input is also coupled to 5 volts d-c through a pull-up resistor 323. The output signal of gate 201 on a line 325, is coupled through an inverter 327 to a switch 335. A voltage divider network including a resistor 331 and a Zener diode 333 between 15v and ground is provided to supply a reference level for this part of the circuit on line 346. Switch 335 has as its input the output of the switch 315 described above. These two switches along with an amplifier 337, having a feedback resistor 339 and an input resistor coupled to its inverting input 341, form the phase sensitive demodulator. Construction here is essentially the same as that associated with amplifier 73 of FIG. 2. The output of the switch 335 is coupled to the non-inverting input of the amplifier 337 and to a resistor 343 which is coupled to the reference level on line 346. The second input of switch 315 is also coupled to the reference level on line 346. This level shifting permits operating between 0 and 15 volts rather than having positive and negative swings. Inverter 327 has its output coupled to +15 through pull-up resistor 329.

The output of the amplifier 337 is coupled through a resistor 345 to the inverting input of an amplifier 347 having in its feedback path two capacitors 399 and 351 in series with a resistor 353 in parallel across the capacitor 351. The reference line 346 is also coupled to the non-inverting input of amplifier 347 through a resistor 355 and capacitor 357 in parallel. This input of the amplifier 347 is also coupled through a resistor 359, to the output of an amplifier 361. Amplifier 347 and its associated components is the integrator of block 119 of FIG. 3.

Amplifier 361, which with its associated components forms the voltage controlled oscillator, has its inverting input coupled through resistor 363 and 365 to the output of amplifier 347. Its non-inverting input is tied to line 346. Capacitive feedback is provided from the output of amplifier 361 to its non-inverting input through a capacitor 367. An additional feedback capacitor 369 is inserted between the output and junction of resistor 363 and 365. A resistor 371 is also tied to this point and provides the 0 input to a switch 373 which has its one input coupled back from its output. The output of this switch is also tied to the output of the amplifier 361. The control line for this switch is 375 and is fed by an inverter 377, is self driven by a NAND gate 379. The NAND gate 379 has as an inhibit input an external signal on line 381. This inhibit input is also coupled to an inverter 383 with the output of which forms the control input for the switch 315. A pull-up resistor 316 is provided for inverter 383. The output of amplifier 361 is coupled through a resistor 385 to an amplifier 387. It is also coupled through a resistor 389 to the inverting input of an amplifier 391. These amplifiers are comparators for generating up and down counts for counter 125.

The inverting inputs of amplifier 391 is also tied through a resistor 393 to ground. The non-inverting input of amplifier 391 is coupled through a resistor 395 to +5 v. Positive feedback from the output of amplifier 391 is accomplished through a resistor 397.

The inverting input of amplifier 387 is tied to +5 v through a resistor 399. It has a positive feedback through resistor 400. The outputs of amplifiers 391 and 387 are inputs to a NAND gate 401 which also has its two inputs tied to +5 v through pull-up resistors 403 and 405. The output gate 401 is coupled to inverter 407 which provides the second input to NAND gate 379. It is also coupled through a resistor 409 to the inverting input of an amplifier 411. The non-inverting input of amplifier 411 is coupled to ground through a resistor 413. A capacitor 415 is provided between ground and the non-inverting input. Feedback in the amplifier 411 is through a resistor 417 and a resistor 419. The junction of these two resistors is tied to the +5 volts lines which is also one side of the secondary of the reference transformer and to one input of a NAND gate 421. The second input of the NAND gate 421 is the output of the amplifier 411. This gate generates a busy signal indicating that conversion is taking place.

The outputs of the amplifiers 387 and 391, respectively, supply the signals into the counter 125. A positive steering voltage, with respect to line 346, after demodulation will result in integrator 347 generating a negative output. This in turn will result in a positive output from VCO amplifier 361. When the VCO voltage goes negative by approximately 2.5 v with respect to line 346, the output of comparator 387 will go to zero. This output over line 501 provides an up count to counter 125. It also through gate 401, inverter 407, gate 379 and inverter 377 is coupled as the control input of switch 373 to reset the VCO amplifier 361 to start another cycle. Similarly, the comparator 391 responds to a positive going output of VCO amplifier 361, with respect to line 361, to provide a down count on line 503 and also to reset the VCO through the same path. Typical values for these various resistors are as follows:

| RESISTORS | VALUES |
|---|---|
| 305,409,94,365,316,329 | 10K |
| 307,311 | 5.1K |
| 77,81,79,339,353,395,419 | 100K |
| 91 | 57K |
| 93,51,343 | 240K |
| 75 | 61.948K |
| 17 | 1.9576K |
| 15 | 3.160K |
| 19 | 8.1523K |
| 37 | 19.9K |
| 39 | 39.92K |
| 41 | 79.88K |
| 291,341 | 160K |
| 292 | 320K |
| 293 | 640K |
| 294a | 470K |
| 294b | 820K |
| 295a | 560K |
| 295b | 2.0M |
| 296 | 5.1M |
| 297 | 10M |
| 45,43 | 20M |
| 399,405,403,414,413,417,323 | 20K |
| 319,321 | 30K |
| 389.393 | 200K |
| 397 | 910K |
| 400 | 710K |
| 331 | 6.3M |
| 371 | 1K |
| -continued | |
| 345 | 300K |
| 355,363 | 51K |
| 344 | 62K |
| 359 | 6.8M |
| CAPACITORS | |
| 369 | .001UF |
| 357 | 10PF |
| 399 | .1UF |
| 351 | .01UF |
| 313 | .33UF |
| 415 | 33PF |
| 362 | 150PF |
| ZENER DIODES | VALUES |
| 314 | IN751A |
| 333 | IN755A |
| EXCLUSIVE OR GATES | DM5486 |
| NAND GATES | DM5400 |
| INVERTERS | DM5406 |
| DRIVERS | DM5400 |
| AMPLIFIERS | LM747,LM101A |
| SWITCHES | CD4053BF |
| COUNTER | DM54193 |
| COMPARATOR 120 | LM139D |

As described previously, the new approximation generates more accurate information using less components and at less cost. The intrinsic error is ±0.5 arc minutes as compared to ±1.8. One ladder network is used as compared to two. One set of switches is used as compared to two. A 0.1% error in the M.S.B. results in an error of 0.65 arc minutes as compared to 1.3. There are no differential tracking errors due to mismatch of two networks over temperature.

Conventional and inexpensive CMOS switches can be used to drive the ladder network because:

(a) it is less sensitive to switch impedance; and (b) the static electricity sensitive control logic is not exposed to the end item user.

The octant select and scaling circuit combine to provide not only the requisite functions but also:

(a) isolate the input Scott "T" transformer from mismatched loading-reducing errors; and (b) eliminate switch resistance of quadrant select from being a direct error source in the approximation resistors.

Various modifications of the embodiment disclosed are possible, such as the following:

A. Invert/non-invert circuitry could be used for both the sin $\theta$ and the cos $\theta$ channels, thus maintaining the appropriate phasing of the steering voltage without requiring the need for invert/non-invert logic to change the phasing of the reference drive of the phase sensitive demodulator. Alternatively, inversion of the sine with appropriate selection logic is also possible.

B. The resistor 19 of FIG. 1 with the weight $K_2/K_3$ could be connected to the sin $\theta$ function before it was scaled down by the ratio of $K_2/K_1$. This would change the value of the resistor to $K_1/K_3$.

C. The scaling of the cos $\theta$ function could be made $K_1/K_2$ and the sin $\theta$ function kept at a unity gain with appropriate changes in value to the balance of the resistors.

D. The analog input could be a 4 wire 400 Hz resolver information, isolated by 1:1 transformers.

E. The analog input could be as shown on FIG. 3, but with an electronic Scott "T" used to generate sin $\theta$, cos $\theta$ information.

F. The analog input could be a 4 wire resolver input with conventional operational amplifiers acting as isolation and voltage translators.

G. The analog inputs could be 60 Hz or any other appropriate frequency rather than 400 Hz or could even be d-c voltages.

H. The steering voltage could be used to control other, conventional types of feedback loops simulating Type 1 and/or Type 2 loops with various characteristics.

I. The steering voltage could be used to be interpreted by a comparator or similarly for use in a conventional successive approximation converter.

J. Digital complementing can be eliminated and/or quadrant selection used instead of octant selection by switching the "$K_2/K_3$" resistor 19 to the appropriate sin $\theta$, cos $\theta$ output. This would require either pre-scaling of the sin $\theta$, cos $\theta$ inputs so that the same value resistor could be used to either side, or two "$K_2/K_3$" resistors, used with single poles single throw switches, could be used if the appropriate difference in value is maintained in order to eliminate the extra pre-scaling.

K. The basic converter can be used in other standard alternative configurations, such as in two-speed devices, digital C.T.'s (where the output is the analog voltage proportional to the steering voltage sin $(\theta-\beta)$) and similar devices.

We claim:

1. In a synchro to digital tracking converter which includes means to generate a steering voltage; said means to generate including a sine-cosine generation circuit and a selection circuit providing inputs to said sine-cosine circuit, a demodulator having the output of said generator as an input, an integrator and voltage control oscillator driven by the demodulator; and an up/down counter generating a digital angle which is fed back to said sine-cosine circuit for comparison purposes, said steering voltage being required to have a magnitude and phase which will properly cause the feedback loop through said demodulator, integrator and voltage controlled oscillator and counter, to result in causing the error between the angle within said counter and the actual angle to approach zero an improved sine-cosine circuit comprising:
    (a) a plurality of double pole single throw switches, each having two inputs and an output, the respective two inputs of each of said switches, being coupled to the sine and cosine outputs of the selection circuit and the outputs of said switches being coupled to a binarily weighted resistor ladder network, the sine input also being coupled through an additional resistor in common with said ladder network;
    (b) a summing amplifier having the output of said ladder network as an input; and
    (c) means for controlling said switches in dependence on the output of said counter.

2. The improvement according to claim 1 and further including an improved selection circuit comprising:
    (a) octant selection means having as inputs a sine voltage and a cosine voltage representative of the synchro output and providing a scaled sine output and negative cosine output, said octant selection circuit adapted to always provide the larger of its two inputs to the cosine output and the smaller signal to the sine output, and to control the sign of the cosine term so that in each quadrant the appropriate phase relationship is maintained; and
    (b) wherein said switches are controlled in dependence on the third through mth bits of said counter, said bits representing the digital angle over an octant, whereby the output of said amplifier will be a voltage proportional to the difference between the actual input angle and the digital output angle.

3. The improvement according to claim 2 wherein said octant selection circuit comprises:
    (a) a first amplifier having a gain of $K_2/K_1$;
    (b) a second amplifier having a gain of 1;
    (c) a first analog switch having first and second inputs, first and second outputs and a switching input, two outputs of said switch tied together and coupled into said first amplifier, the first and second inputs of said switch being coupled respectively to the sine and cosine outputs to be converted;
    (d) a second analog switch similarly configured and having the cosine signal as its first input and the sine signal as its second input, the output of said switch coupled to the inverting input of said second amplifier;
    (e) a voltage divider coupling the non-inverting input of said second amplifier to ground;
    (f) a third analog switch similarly configured having its output coupled to the common point of said voltage divider and having its first input coupled to ground and its second input coupled to the output of said second switch, each of said switches being responsive to a signal at a first level at their switching input to couple their first input to their output and at a second level to couple their second input to their output;
    (g) means to supply a signal at said second level to said first and second switches if only the second or third most significant bit are present and to otherwise supply a signal at said first level; and
    (h) means to supply a signal at said first level to said third switch if said second most significant bit is present and to otherwise supply a signal at said second level.

4. The improvement according to claim 3 wherein said means to supply a signal to said first and second switches comprises an exclusive OR gate having as inputs said second and third most significant bits and providing its output as the switching input to said switches.

5. The improvement according to claim 4 wherein said means to supply a signal to said third switch comprises a further exclusive OR gate having one input tied to a reference potential and its other input coupled to said second most significant bit.

6. The improvement according to claim 3 wherein said sine-cosine circuit comprises M-2 analog switches, where M is the resolution of the converter, each having first and second inputs and first and second outputs, the first and second outputs of each switch tied together so as to form a common output, each also having a switching input, said switches responsive such that with a signal at a first level into said switching input, said first output is coupled to said first input and with a signal at another level, said second output is coupled to said second input; a plurality of resistors having the relative values $2R, 4R, 8R \ldots 2^{M-3}R, 2^{M-3}R$, each having one end coupled to the common output of one of said switches, the other ends of all of said resistors being tied to a common line; a sine input resistor of relative value $K_2$ coupled to the second input of all of said switches; a cosine input resistor of relative value $K_1$ coupled to the first inputs of all of said switches; a further resistor between the input side of said sine resistor and said common line of relative value of $K_2/K_3$; a plurality of exclusive OR gates equal in number to said plurality of switches, the output of said exclusive OR gates being coupled to the respective switching inputs of said switches, all of said exclusive OR gates having as one input the $2^3$ bit, the exclusive OR gate associated with the switch whose output is tied to the resistor of relative value 2R, having as a second input the $2^4$ bit, the exclusive OR gate associated with the switch whose output is coupled to the resistor having the relative value 4R having as its second input the $2^5$ bit and so on, with the first switch having at its output the resistor of relative value $2^{M-3}R$, having at its second input the $2^M$ bit and the second switch having at its output a resistor of value $2^{M-3}R$, having its second input grounded; and an operational amplifier having said common line coupled to its inverting input, said amplifier having a negative feedback resistor of relative value R whereby at the output of said amplifier, said steering voltage will appear, said circuit adapted to receive as inputs a quantity representing $K_2/K_1 \sin\theta$ and $\cos\theta$ to said sine and cosine input resistors respectively and being adapted to carry out the approximation $$\sin(\theta - \beta) \approx \sin\theta \left[ \frac{K_2(1-N)}{1+K_2(1-N)} + K_3 \right] - \cos\theta \frac{K_1 N}{1+K_1 N}$$

where
  $K_1$ is the best fit constant for a sine function from 0° to 45° and is equal to 0.316R.
  $K_2$ is the best fit constant for a cosine function from 0° to 45° and is equal to 0.195755R.
  $K_3$ is the constant at the end point and is equal to $K_1/1+K_1 = 0.240122R$
  N is a running variable from 0 to 1 as $\beta$ varies from 0° to 45°.

7. The improvement according to claim 1 wherein said sine-cosine circuit comprises M-2 analog switches, where M is the resolution of the converter, each having first and second inputs and first and second outputs, the first and second outputs of each switch tied together so as to form a common output, each also having a switching input, said switches responsive such that with a signal at a first level into said switching input, said first output is coupled to said first input and with a signal at another level, said second output is coupled to said second input; a plurality of resistors having the relative values 2R, 4R, 8R ... $2^{M-3}R$, $2^{M-3}R$, each having one end coupled to the common output of one of said switches, the other ends of all of said resistors being tied to a common line; a sine input resistor of relative value $K_2$ coupled to the second input of all of said switches; a cosine input resistor of relative value $K_1$ coupled to the first inputs of all of said switches; a further resistor between the input side of said sine resistor and said common line of relative value $K_2/K_3$; a plurality of exclusive OR gates equal in number to said plurality of switches, the output of said exclusive OR gates being coupled to the respective switching inputs of said switches, all of said exclusive OR gates having as one input the $2^3$ bit, the exclusive OR gate associated with the switch whose output is tied to the resistor of relative value 2R, having as a second input the $2^4$ bit, the exclsuive OR gate associated with the switch whose output is coupled to the resistor having the relative value 4R having as its second input the $2^5$ bit and so on, with the first switch having at its output the resistor of relative value $2^{M-3}R$, having at its second input the $2^M$ bit and the second switch having at its output a resistor of value $2^{M-3}R$, having its second input grounded; and an operational amplifier having said common line coupled to its inverting input, said amplifier having a negative feedback resistor of relative value R whereby at the output of said amplifier, said steering voltage will appear, said circuit adapted to receive as inputs a quantity representing $K_2/K_1 \sin\theta$ and $\cos\theta$ to said sine and cosine input resistors respectively and being adapted to carry out the approximatation $$\sin(\theta - \beta) \approx \sin\theta \left[ \frac{K_2(1-N)}{1+K_2(1-N)} + K_3 \right] - \cos\theta \frac{K_1 N}{1+K_1 N}$$

where
  $K_1$ is the best fit constant for a sine function from 0° to 45° and is equal to 0.316R.
  $K_2$ is the best fit constant for a cosine function from 0° to 45° and is equal to 0.195755R.
  $K_3$ is the constant at the end point and is equal to $K_1/1+K_1 = 0.240122R$
  N is a running variable from 0 to 1 as $\beta$ varies from 0° to 45°.

8. The improvement according to claim 3 wherein said demodulator receives a reference input and further including means to provide a reference input having a phase which is a function of the octant selected whereby a steering voltage of a given polarity will always indicate an error in a given direction.

9. The improvement according to claim 8 wherein said means to provide a phase comprise ANDing means having as inputs the second and third most significant bits; first exclusive OR means having as inputs the output of said ANDing means and the most significant bit; and second exclusive OR means having as inputs the reference voltage and the output of said first exclusive OR means.

10. The improvement according to claim 9 wherein said reference voltage is sinusoidal and further including means for converting said reference voltage into a square wave interposed between the reference voltage source and said means to provide.

11. The improvement according to claim 8 wherein said means to provide are adapted to invert the reference voltage in the second through fifth quadrants and to not invert the reference voltage in the remaining quadrants.

12. A method of constructing a sine-cosine circuit for use in synchro to digital tracking converter of the type which includes selection circuit having the synchro outputs as inputs means to selecting, coupled its inputs to two outputs based on the quadrant or octant, a sine-cosine circuit having the outputs of the selection circuit as an input for generating a steering voltage, a demodulator having said steering voltage as an input; an integrator for integrating the output of said demodulator, a voltage controlled oscillator receiving an input from the output of said integrator, and an up/down counter receiving the output of said voltage controlled oscillator and generating a digital angle which is fed back to the sine-cosine circuit for comparison with the input angle in analog form, the steering voltage being required to have a magnitude and phase which will properly cause the feedback loop through the demodulator, integrator, voltage controlled oscillator and counter, to drive the error between the angle within said counter and the actual angle toward zero, comprising constructing the sine-cosine generator using a single binarily weighted resistor ladder network, the resistors of said network all having one side tied together and to a summing amplifier and coupling the inputs from said selection circuit to said resistors through analog switches, of the type having first and second inputs and first and second outputs, the switches responsive to a switching signal such that at one level the first input is coupled to the first output and at another level the second input is coupled to the second output, by tying the two outputs of each of said switches together and to one of the resistors of said ladder, the respective inputs of said switches being tied to the sine and cosine inputs, and controlling said switches with the outputs of said counter whereby, since the nature of the sine-cosine conversion is such that a resistor in the ladder need never be used for both sine and cosine at the same time, both the sine and cosine functions can be implemented with a single ladder network with the function $\sin \theta \cos \beta - \cos \theta \sin \beta$ appearing at said amplifier output.

13. The method of claim 12 and further including:
 (a) making a selection on on octant by octant basis and selecting as the cosine output to said sine-cosine circuit the larger of its two inputs and the sine signal as the smaller;
 (b) scaling said sine signal by a factor $K_2/K_1$;
 (c) inverting said cosine signal in the second and fourth quadrants;
 (d) inverting the reference voltage fed to the demodulator in the second through fifth octants;
 (e) coupling the selected and scaled sine ouput to said amplifier through a resistor of relative value $K_2/K_2$; and
 (f) coupling said selected and scaled sine output and said selected cosine output respectively to the switches through resistors of relative value $K_2$ and $K_1$ where $K_1$ is the best fit constant for a sine function from 0° to 45° and is equal to 0.316R, $K_2$ is the best fit constant for a cosine function from 0° to 45° and is equal to 0.195755R, $K_3$ is the constant at the end point and is equal to $K_1/1+K_1=0.240122R$, and N is a running variable from 0 to 1 as $\beta$ varies from 0° to 45°.

* * * * *